US006639795B1

(12) United States Patent
Cooper

(10) Patent No.: US 6,639,795 B1
(45) Date of Patent: Oct. 28, 2003

(54) FLOW THROUGH BUTTERFLY BACKPANE

(76) Inventor: Steve Cooper, 735 S. Vinewood St., Escondido, CA (US) 92029

( * ) Notice: Subject to any disclaimer, the term of this patent is extended or adjusted under 35 U.S.C. 154(b) by 0 days.

(21) Appl. No.: 10/197,591

(22) Filed: Jul. 18, 2002

Related U.S. Application Data

(60) Provisional application No. 60/356,733, filed on Feb. 15, 2002.

(51) Int. Cl.7 .................................................. H05K 7/20
(52) U.S. Cl. ....................... 361/692; 165/80.3; 439/485; 454/184
(58) Field of Search ............................... 439/61, 62, 74, 439/75, 76.1, 485; 454/184; 165/80.3, 185, 121–126; 312/236; 361/690, 692, 693, 694, 695, 717–719, 796, 797, 799, 803

(56) References Cited

U.S. PATENT DOCUMENTS

| | | | | | |
|---|---|---|---|---|---|
| 4,998,180 A | * | 3/1991 | McAuliffe et al. | .......... | 361/684 |
| 5,023,754 A | * | 6/1991 | Aug et al. | ................... | 361/800 |
| 5,486,681 A | * | 1/1996 | Dagnac et al. | .............. | 219/400 |
| 5,680,295 A | * | 10/1997 | Le et al. | ..................... | 361/695 |
| 6,202,110 B1 | * | 3/2001 | Coteus et al. | ............... | 710/102 |
| 6,262,890 B1 | * | 7/2001 | Dhawan et al. | ............. | 361/690 |

* cited by examiner

*Primary Examiner*—Gerald Tolin
(74) *Attorney, Agent, or Firm*—Patent & Trademark Services; Joseph H. McGlynn

(57) ABSTRACT

A backpane which receives a plurality of printed circuit boards and the backpane has air holes to allow ventilation.

6 Claims, 2 Drawing Sheets

FLOW THROUGH BUTTERFLY BACKPANE

Applicant claims the priority of Provisional Ser. No. 60/356,733, filed Feb. 15, 2002.

BACKGROUND OF THE INVENTION

This invention relates, in general, to backpanes, and, in particular to backpanes which receive printed circuit boards

DESCRIPTION OF THE PRIOR ART

In the prior art various types of printed circuit board receiving devices have been proposed. For example, U.S. Pat. No. 6,262,890 to Dhawan et al discloses a controller chip set having two or more chips mounted on opposite sides of the chip set.

U.S. Pat. No. 6,202,110 to Coteus et al discloses memory cards placed back to back on an active back plane.

U.S. Pat. No. 5,680,295 to Le et al discloses a cooling system for a computer with a ventilated back plane for a disk drive cage.

U.S. Pat. No. 5,023,754 to Aug et al discloses a double sided back plane for increasing the logic element density in a logic cage.

SUMMARY OF THE INVENTION

The present invention is directed to a backpane which receives a plurality of printed circuit boards and the backpane has air holes to allow ventilation.

It is an object of the present invention to provide a new and improved backpane.

It is an object of the present invention to provide a new and improved backpane that will receive printed circuit boards from opposite sides of the backpane.

It is an object of the present invention to provide a new and improved backpane that will provide improved ventilation.

These and other objects and advantages of the present invention will be fully apparent from the following description, when taken in connection with the annexed drawings.

DESCRIPTION OF THE PREFERRED EMBODIMENT

Figure 1:
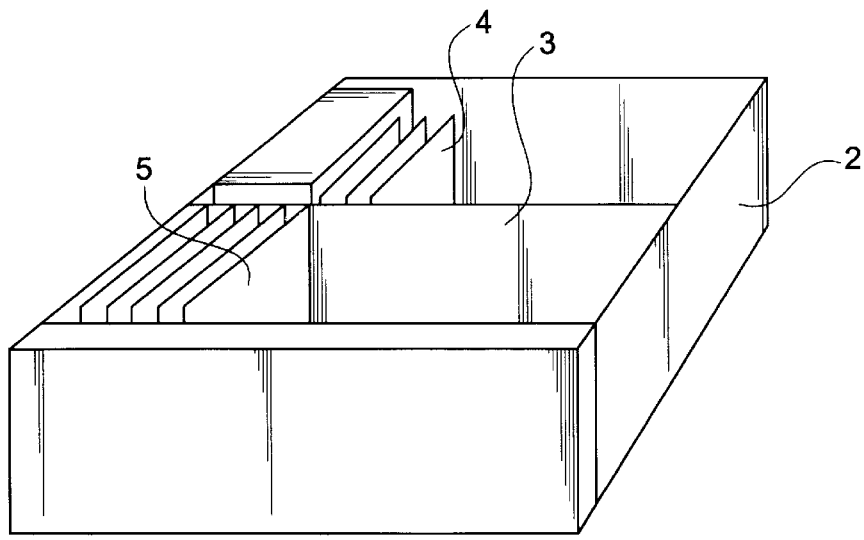
FIG. 1 is a perspective view of the present invention inserted into a blade server style computer.

Referring now to the drawings in greater detail, FIG. 1 shows the backpane 3 of the present invention mounted within a blade server style computer which has an enclosure 2 designed to receive the backpane 3 and a plurality of printed circuit boards (PCB's) 4, 5 that are connected, both electrically and physically, to the backpane 3. It should be noted that only some of the PCB's are shown in FIG. 1 for purposes of clarity, however, any number of PCB's could be used with the backpane. Also, the specific shape and size of the enclosure are not material to the present invention and, therefore, the enclosure, as well as the backpane and PCB's, are shown schematically, again for purposes of clarity.

Figure 2:
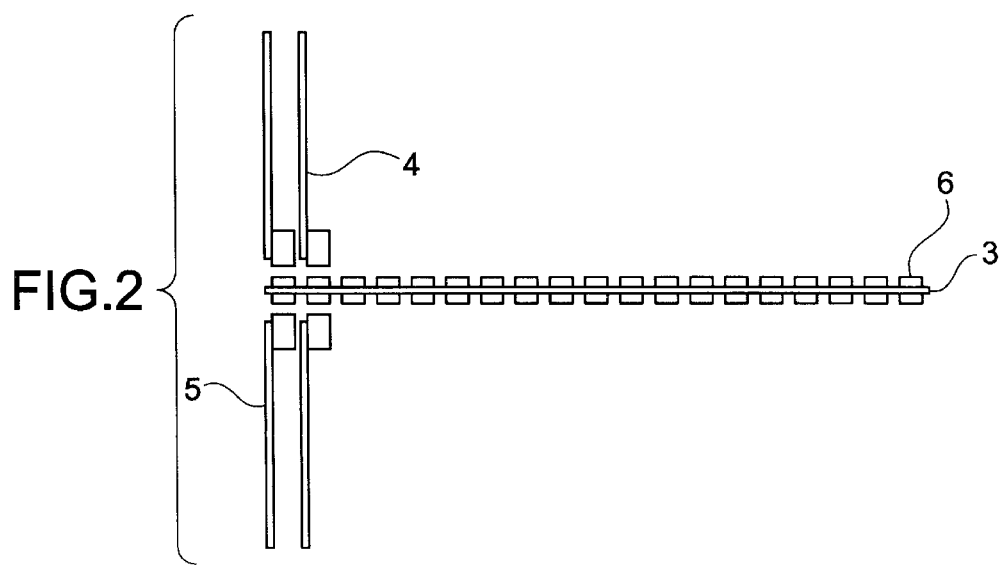
FIG. 2 is a top view of the present invention with some of the printed circuit boards that can be connected thereto.

As shown in FIGS. 1 and 2, the backpane 3 has a plurality of connectors, shown schematically at 6 in FIG. 2, which will electrically connect PCB's 4 mounted to the back of the backpane 3, and will connect PCB's 5 mounted to the front of the backpane 3. It is important in blade server style computers that a maximum number of PCB's be connected to the system. Mounting PCB's to the front and to the back of the backpane 3 will effectively double the number of boards that can be plugged into a single backpane. It should be noted that the enclosure shown in FIG. 1 is a conventional enclosure in which a portion of the enclosure opens up so the blades can be installed and removed.

Figure 3:
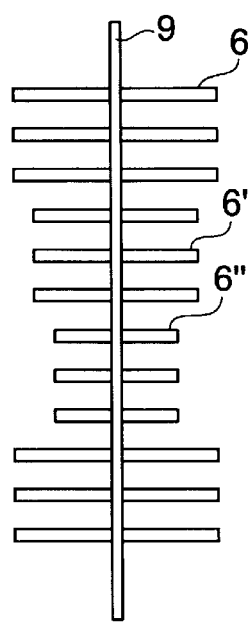
FIG. 3 is a side view of the back plane showing the connectors associated with the back plane.
Figure 4:
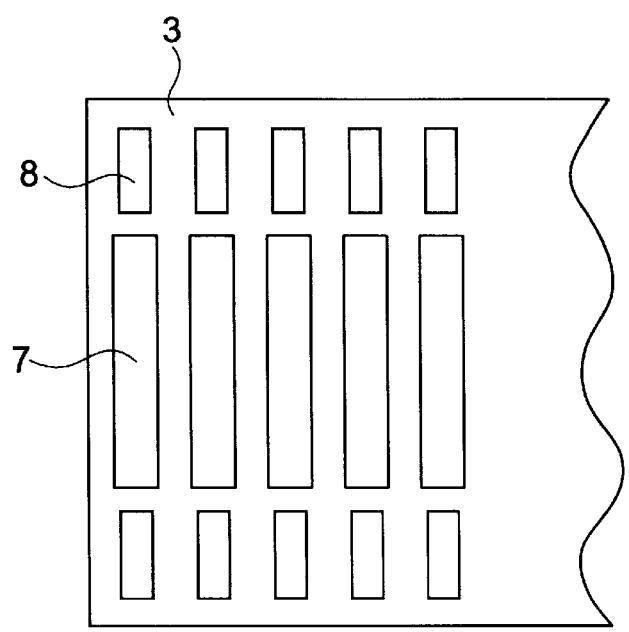
FIG. 4 is a partial plan view of the back plane showing the openings for connectors associated with the back plane and the ventilation apertures.

As shown in FIG. 3, a connector 9 is connected to the backpane through apertures (see apertures 7 in FIG. 4). The connector has a plurality of contact pins 6, 6', 6", and as can be clearly seen in FIG. 3, the pins are of different lengths, with 6 being the longest, 6' being of an intermediate length, and 6" being the shortest. Under conditions where "hot swapping" of the boards 4, 5 may be required, the varied length of the pins will allow hot swapping without damage to the PCB's or the backpane. The term "hot swapping" means inserting or removing the PCB's without turning off power to the computer.

In order to allow "hot swapping" the power and ground pins 6 are the longest, the signal pins 6' are the medium length pins, and special signal pins 6" are the shortest. Therefore, when a board is inserted, or removed, from the backpane 3, since the ground pins 6 are the longest, they will engage the corresponding contacts on the PCB's first (if the board is being inserted) and will disengage the corresponding contacts on the PCB's last (if the board is being removed). This will prevent any sparks from occurring between the signal contacts 6' and the special signal contacts 6" and the corresponding contacts on the PCB's. Since the ground pins will always engage first (if the board is being inserted) and disengage last (if the board is being removed) there will be no damage to the other pins on the PCB's. It is important that the power pins or contacts are connected and "settled" before the signal pins are connected. The shortest pins are the last pins to mate and are the reset and power-on signals that tell the modules that everything else is connected.

In order to cool the PCB's 4, 5 in the front and rear of the backpane 3, air must be allowed to flow from the front to the rear of the enclosure 2. In order to maximize the density of the PCB's (i.e. allow as many PCB's to be connected to the backpane as possible) there is very little space inside the enclosure once the PCB's are inserted into the enclosure. Therefore, it is important to realize that the backpane, in effect, becomes a solid wall and prevents the effective flow of cooling air. The present invention solves this problem by providing air holes as shown at 8 in FIG. 4. It is important when placing the air holes on the backpane 3 to provide as many as possible, however, it is critical that in doing so, the strength of the backpane is not compromised. Therefore, the air holes are placed above and below the apertures 7 that will receive the connectors (not shown) in the back plane 3 that will electrically connect the PCB's 4, 5. If the air holes were placed between the apertures 7, the strength of the backpane might be compromised.

Although the Flow Through Butterfly Backpane and the method of using the same according to the present invention has been described in the foregoing specification with considerable details, it is to be understood that modifications may be made to the invention which do not exceed the scope of the appended claims and modified forms of the present invention done by others skilled in the art to which the invention pertains will be considered infringements of this invention when those modified forms fall within the claimed scope of this invention.

What I claim as my invention is:

1. A backpane for receiving a plurality of printed circuit boards, said backpane comprising:

a board having a length, width and height, aperture means positioned along said length for receiving electrical connectors, ventilation means positioned along said length for allowing air to flow from one side of said board to another, said ventilation means comprising a plurality of holes, said holes being positioned above and below said aperture means, and wherein board has a plurality of connectors positioned in each of said aperture means, each of said connectors having a plurality of contacts connected thereto, and said contacts having different lengths, and wherein said contacts are of three different lengths.

2. The backpane as claimed in claim 1, wherein said holes are arranged in pairs with one of said pair of holes positioned above each one of said aperture means and another of said pair of holes being positioned below each one of said aperture means.

3. The backpane as claimed in claim 1, wherein at least one of said contacts is a ground contact, and said ground contact has the longest length.

4. The backpane as claimed in claim 1, wherein at least one of said contacts is a special signal contact, and said special signal contact has the shortest length.

5. The backpane as claimed in claim 1, wherein at least one of said contacts is a signal contact, and said signal contact has an intermediate length.

6. The backpane as claimed in claim 1, wherein said contacts comprise ground contacts, special signal contacts and signal contacts, and said ground contacts have the longest length, and said special signal contacts have the shortest length, and said signal contacts have a length between said ground contacts and said special signal contacts.

* * * * *